United States Patent
Tkachev et al.

(10) Patent No.: US 12,020,762 B2
(45) Date of Patent: Jun. 25, 2024

(54) METHOD OF DETERMINING DEFECTIVE DIE CONTAINING NON-VOLATILE MEMORY CELLS

(71) Applicant: Silicon Storage Technology, Inc., San Jose, CA (US)

(72) Inventors: Yuri Tkachev, Sunnyvale, CA (US); Jinho Kim, Saratoga, CA (US); Cynthia Fung, San Jose, CA (US); Gilles Festes, Fuveau (FR); Bernard Bertello, Bouches du Rhones (FR); Parviz Ghazavi, San Jose, CA (US); Bruno Villard, Aix en Provence (FR); Jean Francois Thiery, Vaucluse (FR); Catherine Decobert, Pourrieres (FR); Serguei Jourba, Aix en Provence (FR); Fan Luo, Fremont, CA (US); Latt Tee, San Francisco, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 58 days.

(21) Appl. No.: 17/576,754

(22) Filed: Jan. 14, 2022

(65) Prior Publication Data
US 2023/0101585 A1 Mar. 30, 2023

Related U.S. Application Data

(60) Provisional application No. 63/248,964, filed on Sep. 27, 2021.

(51) Int. Cl.
*G11C 29/50* (2006.01)

(52) U.S. Cl.
CPC ............ *G11C 29/50004* (2013.01); *G11C 2029/5006* (2013.01)

(58) Field of Classification Search
CPC ...... G11C 29/50004; G11C 2029/5006; G11C 29/44; G11C 29/50016; G11C 29/06;
(Continued)

(56) References Cited

U.S. PATENT DOCUMENTS

| | | | |
|---|---|---|---|
| 6,618,290 B1 * | 9/2003 | Wang | G11C 16/0475 365/185.28 |
| 2006/0120165 A1 | 6/2006 | Hemink | |

(Continued)

FOREIGN PATENT DOCUMENTS

TW 202127458 7/2021

OTHER PUBLICATIONS

PCT Search Report and Written Opinion dated Jun. 15, 2022 corresponding to the related PCT Patent Application No. US2022/012710.

*Primary Examiner* — Mohammed A Bashar
(74) *Attorney, Agent, or Firm* — DLA Piper LLP (US)

(57) ABSTRACT

A method of testing non-volatile memory cells formed on a die includes erasing the memory cells and performing a first read operation to determine a lowest read current RC1 for the memory cells and a first number N1 of the memory cells having the lowest read current RC1. A second read operation is performed to determine a second number N2 of the memory cells having a read current not exceeding a target read current RC2. The target read current RC2 is equal to the lowest read current RC1 plus a predetermined current value. The die is determined to be acceptable if the second number N2 is determined to exceed the first number N1 plus a predetermined number. The die is determined to be defective if the second number N2 is determined not to exceed the first number N1 plus the predetermined number.

15 Claims, 8 Drawing Sheets

(58) Field of Classification Search
CPC .... G11C 2029/0403; G11C 2029/0405; G11C 2029/5002
See application file for complete search history.

(56) References Cited

U.S. PATENT DOCUMENTS

| | | |
|---|---|---|
| 2006/0221729 A1 | 10/2006 | Iwai |
| 2013/0114337 A1* | 5/2013 | Markov ................ G11C 29/06 365/185.18 |
| 2016/0240269 A1* | 8/2016 | Zhou ................ G11C 29/50008 |
| 2019/0214100 A1 | 7/2019 | Puthenthermadam |
| 2020/0160933 A1 | 5/2020 | Sun |
| 2021/0192333 A1 | 6/2021 | Thiruvengadam |

\* cited by examiner

METHOD OF DETERMINING DEFECTIVE DIE CONTAINING NON-VOLATILE MEMORY CELLS

RELATED APPLICATIONS

This application claims the benefit of U.S. Provisional Application No. 63/248,964, filed Sep. 27, 2021, and which is incorporated herein by reference.

FIELD OF THE INVENTION

The present invention relates to memory devices, and more particularly to non-volatile memory devices.

BACKGROUND OF THE INVENTION

Non-volatile memory devices having memory cells each with a floating gate disposed over and insulated from a channel region of a semiconductor substrate are known. The charge on the floating gate controls the conductivity of the channel region during a read operation. To program the memory cell, electrons are placed in the floating gate during a program operation. To erase the memory cell, the electrons are removed from the floating gate during an erase operation. The program state of the memory cell is dictated by the charge (i.e., number of electrons) on the floating gate, which is measured during a read operation by detecting the level of current (referred to as the read current) through the channel region when the appropriate read voltages are applied to the memory cell. The higher the program state of the memory cell (i.e., the greater number of electrons on the floating gate), the lower the read current. Conversely, the lower the program state (i.e., the fewer number of electrons on the floating gate), the higher the read current. The program state of the memory cell can be set to store data. For example, a high program state can reflect a "0" bit value, and a low program state can reflect a "1" bit value. The memory cell can also be operated in analog mode where any number of program states can be used to store data.

During die manufacturing, it is known to perform electrical testing to ensure the memory cells on any given die meet quality standards. One of those tests can be an accelerated data retention test. After memory cell formation, all memory cells on a die are erased, and a read operation is performed to ensure that the read current is above a certain predetermined threshold. If one or more memory cells exhibit read currents below a predetermined read current threshold, then the die is considered defective. After that the dies are subjected to a high temperature bake (can be referred to as a data retention bake), and the read operation is repeated. If some memory cells on a die are defective, they may experience some change of the charge in the floating gate, and their read current decreases below the predetermined read current threshold. Therefore, if the read current of a memory cell is below, or drops below, the predetermined read current threshold, the die containing this memory cell is considered defective.

One challenge with the read test can be determining the proper predetermined read current threshold for the read test, and how best to apply it. Even with a die containing only good memory cells, there still will be a range of read current values for the good memory cells, not just a single read current value. Moreover, during a data retention bake, all memory cells on a die may experience some minor decrease of read current. However, defective memory cells may experience a larger read current drop compared to normal memory cells. The challenge is reliably detecting the presence of these defective cells, whose read currents deviate from the normal range of read currents exhibited by the good memory cells. If the predetermined read current threshold is set too high, then dies with only good memory cells can be erroneously determined to be defective. If the predetermined read current threshold is set too low, then dies with defective memory cells can be erroneously determined to be not defective. Another issue is that the range of read current values for good memory cells can vary from die to die. Therefore, an ideal predetermined read current threshold for one die can be less accurate for another die in reliably determining which dies are good and which are defective.

BRIEF SUMMARY OF THE INVENTION

The aforementioned problems and needs are addressed by a method of testing non-volatile memory cells formed on a die that includes erasing the non-volatile memory cells, performing a first read operation after the erasing of the non-volatile memory cells to determine a lowest read current RC1 for the non-volatile memory cells and a first number N1 of the non-volatile memory cells having the lowest read current RC1, performing a second read operation to determine a second number N2 of the non-volatile memory cells having a read current not exceeding a target read current RC2, wherein the target read current RC2 is equal to the lowest read current RC1 plus a predetermined current value, determining whether the second number N2 exceeds the first number N1 plus a predetermined number, and determining the die is acceptable if the second number N2 is determined to exceed the first number N1 plus the predetermined number, or determining the die is defective if the second number N2 is determined not to exceed the first number N1 plus the predetermined number.

A method of testing non-volatile memory cells formed on a die that includes erasing the non-volatile memory cells, performing a first read operation after the erasing of the non-volatile memory cells to determine a highest threshold voltage TV1 for the non-volatile memory cells and a first number N1 of the non-volatile memory cells having the highest threshold voltage TV1, performing a second read operation to determine a second number N2 of the non-volatile memory cells having a threshold voltage not below a target threshold voltage TV2, wherein the target threshold voltage TV2 is equal to the highest threshold voltage TV1 minus a predetermined voltage value, determining whether the second number N2 exceeds the first number N1 plus a predetermined number, and determining the die is acceptable if the second number N2 is determined to exceed the first number N1 plus the predetermined number, or determining the die is defective if the second number N2 is determined not to exceed the first number N1 plus the predetermined number.

A method of testing non-volatile memory cells formed on a die that includes programming the non-volatile memory cells, performing a first read operation after the programming of the non-volatile memory cells to determine a lowest threshold voltage TV3 for the non-volatile memory cells and a first number N1 of the non-volatile memory cells having the lowest threshold voltage TV3, performing a second read operation to determine a second number N2 of the non-volatile memory cells having a threshold voltage not exceeding a target threshold voltage TV4, wherein the target threshold voltage TV4 is equal to the lowest threshold voltage TV3 plus a predetermined voltage value, determining whether the second number N2 exceeds the first number N1 plus a predetermined number, and determining the die is acceptable if the second number N2 is determined to exceed the first number N1 plus the predetermined number, or determining the die is defective if the second number N2 is determined not to exceed the first number N1 plus the predetermined number.

Other objects and features of the present invention will become apparent by a review of the specification, claims and appended figures.

DETAILED DESCRIPTION OF THE INVENTION

Figure 1:
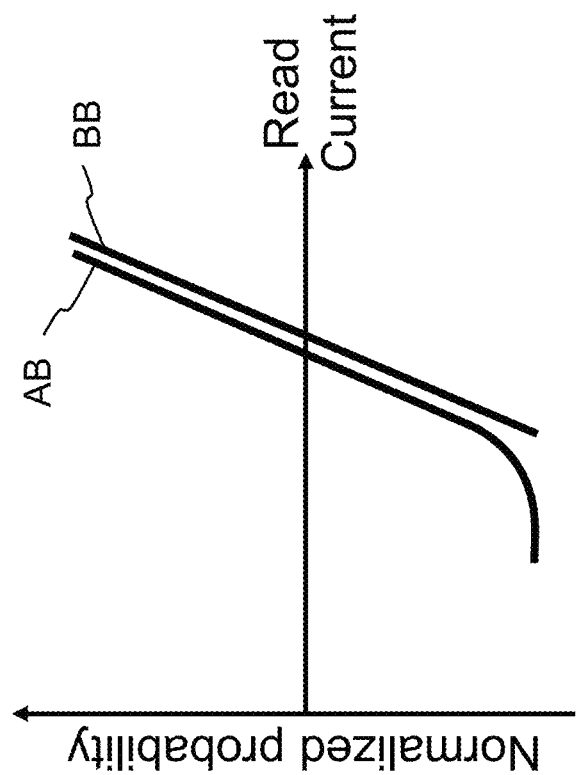
FIG. 1 is a graph illustrating distributions of the normalized probability of read current for a die having no defective memory cells.

Read testing of erased non-volatile memory cells on a die exploiting the normalized probability of read current for the various memory cells on the die is disclosed. FIG. 1 illustrates the normalized probability of read current for the memory cells in a die that contains only good memory cells, both before a data retention bake operation on the die (shown by line BB for before-bake) and after the bake operation on the die (shown by line AB for after-bake). In FIG. 1, each point on the normalized distribution represents the cumulative number of memory cells exhibiting a read current at or below the corresponding read current value. The present inventors discovered that such a distribution is normal (linear in the normalized probability scale) if all the memory cells are good, but that defective cells may deviate from that linear distribution. As shown in FIG. 1, the bake operation tends to lower the read current of the erased memory cells. However, there is a linear distribution of normalized probability of read current both before and after the bake operation. Because there are no memory cells that deviate from this linear distribution of normalized probability of read current, the die is deemed good.

Figure 2:
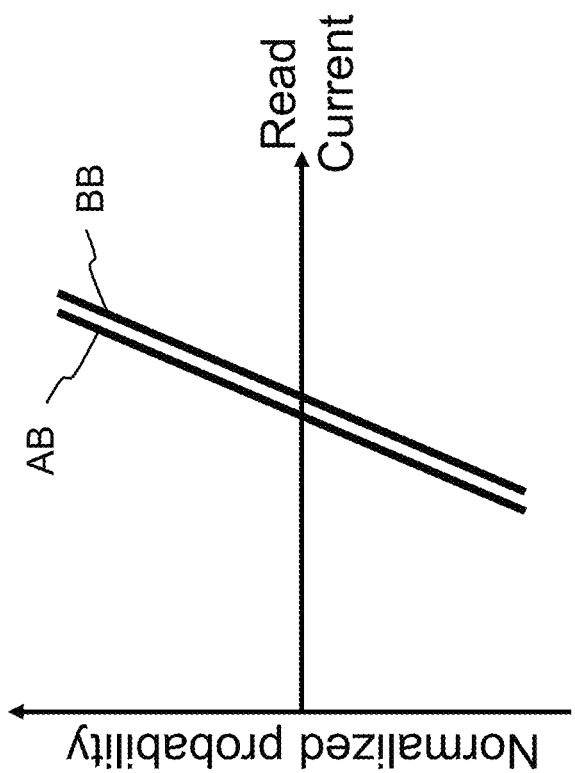
FIG. 2 is a graph illustrating distributions of the normalized probability of read current for a die having defective memory cells.

FIG. 2 illustrates the normalized probability of read current for the memory cells on a die that contains some defective memory cells. In particular, while the before bake normalized distribution does not include read current values that deviate from the linear distribution of normalized probability of read current, that is not the case for the after bake normalized distribution, which shows memory cells with read currents well below the rest of the memory cells that exhibit the linear distribution of normalized probability of read current. Specifically, the distribution of normalized probability of read current (after the bake operation) includes a tail portion that deviates significantly from the linear portion of the distribution, which is indicative of defective memory cells that warrant finding the die defective. It should be noted that a tail portion could exist in the prebake normalized probability of read current as well, also indicative of defective memory cells and therefore a defective die.

Figure 4:
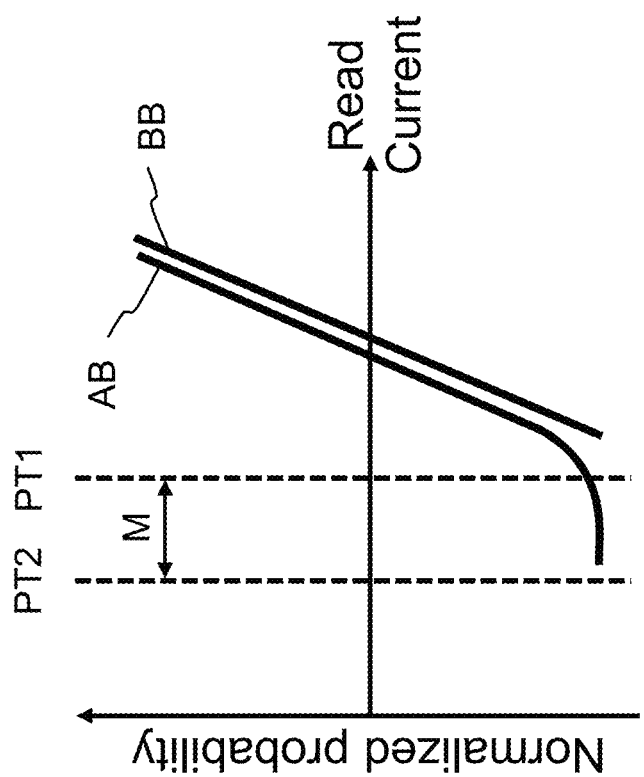
FIG. 4 is a graph illustrating two possible predetermined thresholds of read current that could be used to determine if there are defective memory cells for a die having defective memory cells.
Figure 3:
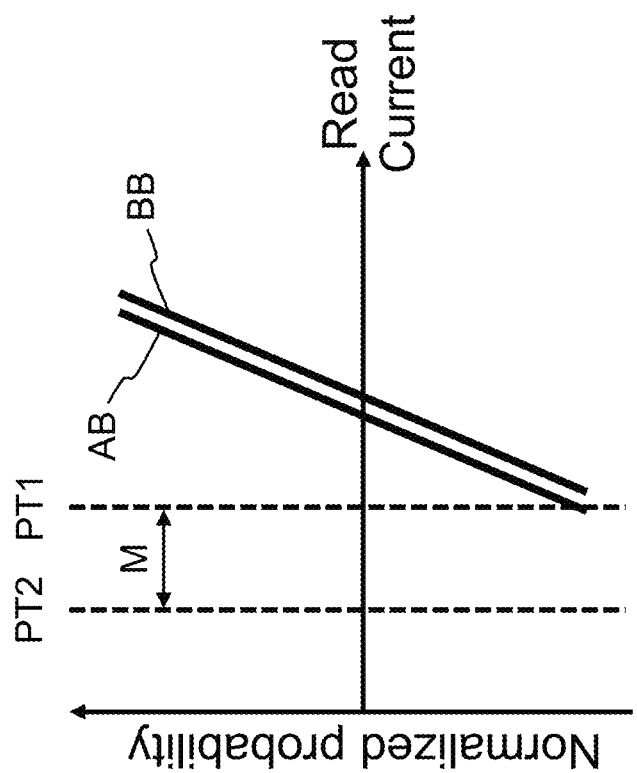
FIG. 3 is a graph illustrating two possible predetermined thresholds of read current that could be used to determine if there are defective memory cells for a die having no defective memory cells.

The drawbacks of using a predetermined read current threshold to detect defective memory cells become evident when considering the normalized probability of read current for both good die and defective die. FIG. 3 illustrates the normalized probability of read current for the memory cells in a die that contains only good memory cells, with two example predetermined read current thresholds for the read current testing. Predetermined threshold PT1 represents no margin, meaning one or more memory cells represented by the lower end of the normalized probability of read current have a read current that does not meet the predetermined threshold PT1. Using the predetermined threshold PT1 runs the risk that the die is deemed defective when in fact it should not be deemed defective, since the distribution is linear. Predetermined threshold PT2 represents a margin M, meaning all memory cells do meet the predetermined threshold PT2 (and in fact exceed the predetermined threshold PT2 by an amount of margin M), so that the die is properly deemed not defective. Using a predetermined threshold PT2 with margin M can be advantageous because the normalized probability distributions can shift somewhat from die to die, so a margin M for the predetermined threshold could avoid falsely determining a die to be defective. However, using a margin M may mean a defective die is not properly identified as defective because some of the defective memory cells still have a read current above the predetermined threshold PT2, as illustrated in FIG. 4 (which is the normalized probability of read current for the memory cells in a die that contains defective memory cells, showing a non-linear distribution, i.e. with a tail). Moreover, the normalized distribution of the read current can vary slightly die to die, which means the risk of misidentifying good and defective die is increased when using a single predetermined read current threshold for all die (i.e., a given predetermined read current threshold producing accurate test results for some dies would not do so for other dies). Thus, using a single, predetermined read current threshold for the read current test is not ideal.

Figure 5:
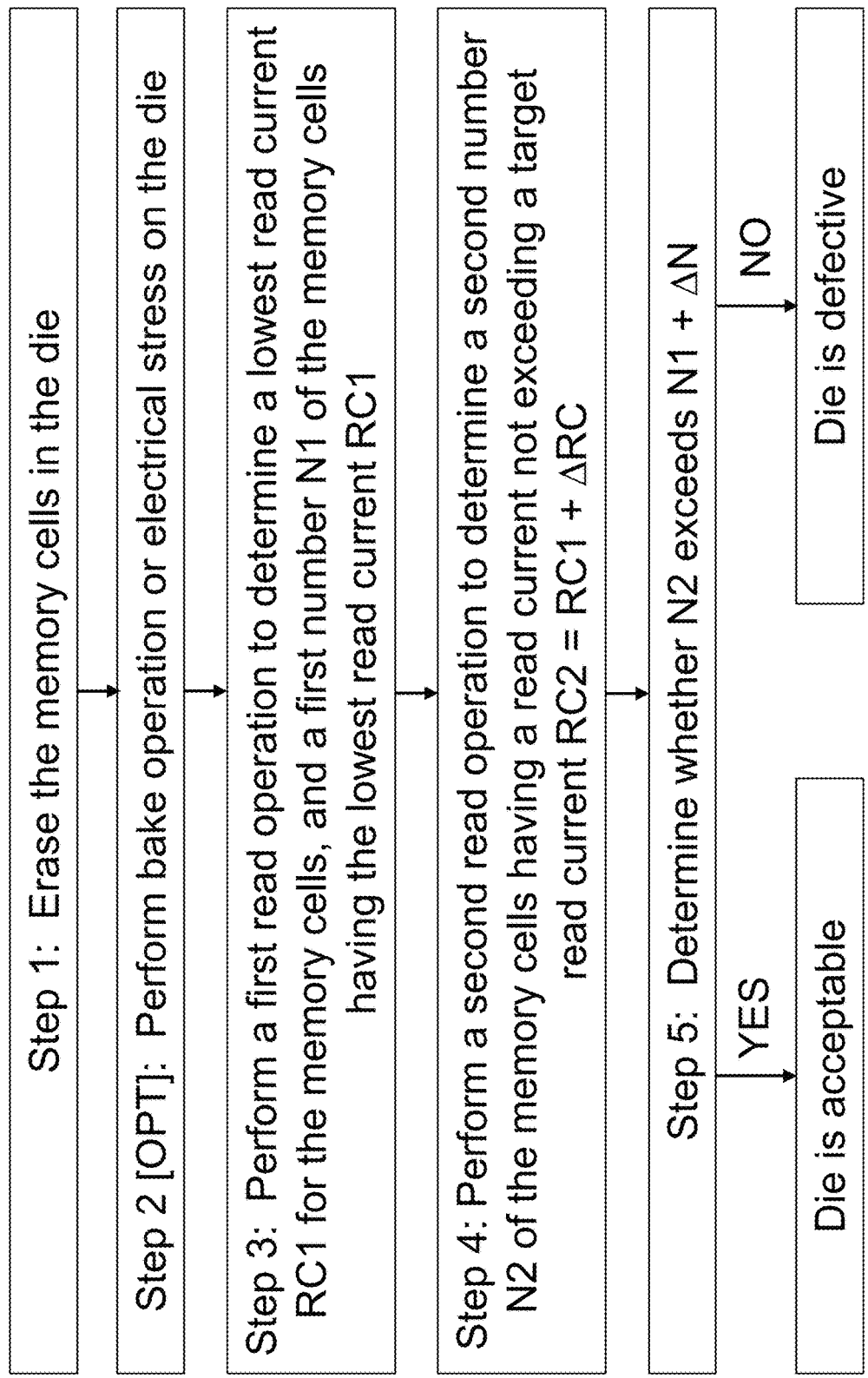
FIG. 5 is a flow diagram illustrating the steps in determining if a die is defective.
Figure 7:
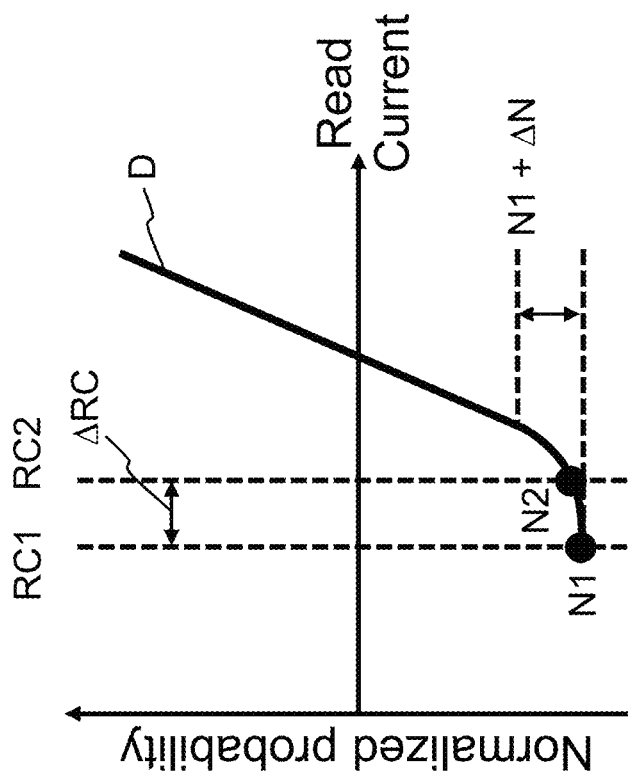
FIG. 7 is a graph illustrating the application of the steps in FIG. 5 for a die having defective memory cells.
Figure 6:
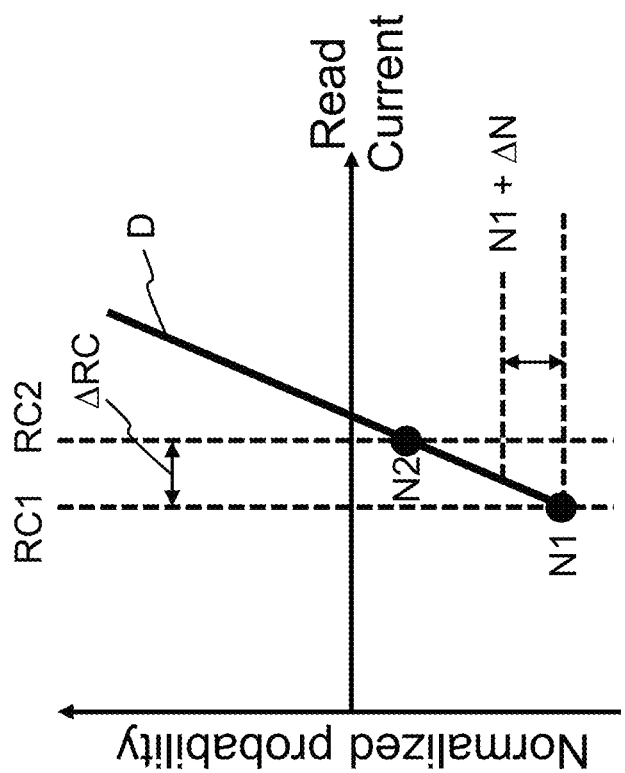
FIG. 6 is a graph illustrating the application of the steps in FIG. 5 for a die having no defective memory cells.

The solution is the read test technique shown in FIG. 5, and illustrated in FIGS. 6 and 7. The present inventors discovered that more accurate test results can be achieved by detecting outlier cell read currents rather than read currents falling below a predetermined read current threshold. The technique is described with respect to distribution D, which corresponds to the distribution of normalized probability BB in FIGS. 1-4 if the read test is performed before the bake operation, or which corresponds to the distribution of normalized probability AB in FIGS. 1-4 if the read test is performed after the bake operation. The read test of FIG. 5 can be, but need not be, performed twice, once before the bake operation and again after the bake operation. It has been determined that the stresses induced by the bake operation can create the tail in the distribution D shown in FIG. 7 that did not exist before such stress. Therefore, performing the read test of FIG. 5 after the stresses induced by the bake operation on the die may be advantageous in certain examples. In fact, performing the read test of FIG. 5 after other stresses are applied to the die (e.g., electrical stress such as a so called "disturb" stress resulting from voltages applied to the memory cell) could also be advantageous in detecting defective memory cells and defective die in certain examples.

In Step 1, the memory cells in the die are erased using an erase operation (i.e., a conventional erase operation well known in the art). In Step 2, a bake operation or electrical stress is performed. A non-limiting example of a bake operation can include subjecting the wafer containing the die to 250 degrees Celsius for a period of three days. A non-limiting example of an electrical stress is the application of one or more voltages to certain gates or the source/drains regions of the memory cells. Step 2 is labeled "OPT" for optional, because as described above, the read test can be performed before and/or after the bake operation or electrical stress, or even without a bake operation or electrical stress. In Step 3, a first read operation is performed to determine the lowest read current RC1 for all the memory cells being tested (e.g., preferably all the memory cells on the die, but a subset of the memory cells on the die can be tested at any given time as well), and a first number N1 of memory cells having that lowest read current RC1. An example distribution D of normalized probability of read current for a die with only good memory cells is shown in FIG. 6. An example distribution D for a die with some defective memory cells is shown in FIG. 7. RC1 can be found using a binary search or other search algorithm for all the memory cells being tested. In Step 4, a second read operation is performed to determine a second number N2 of the memory cells having a read current not exceeding (i.e., equal to or below) a target read current RC2, where RC2=RC1+$\Delta$RC. The value $\Delta$RC is a predetermined current value, and can be selected so that the target read current RC2 corresponds to read current for memory cells in a main portion of the distribution D (i.e., $\Delta$RC represents a sufficient detectable gap between the memory cells at the tail portion of the distribution of a defective die and the edge of the main portion (e.g., linear portion) of distribution D, so that the defective memory cells can be detected).

In Step 5, it is determined whether the second number N2 exceeds the first number N1 plus $\Delta$N, where $\Delta$N is a predetermined number. If the determination is yes, that the second number N2 exceeds N1+$\Delta$N, then it is concluded that the die contains no outlier cells, and the die containing the memory cells is determined to be acceptable. Conversely, if the determination is no, that the second number N2 does not exceed N1+$\Delta$N, then the die containing the memory cells is determined to be defective. $\Delta$N can be selected such that if there is a tail in the distribution D, then the die will be determined to be defective because the second number N2 would not exceed N1+$\Delta$N (i.e., would be less than or equal to N1+$\Delta$N). However, if there is no tail in the distribution D, then the die will be determined to be acceptable because the second number N2 would exceed N1+$\Delta$N. This determination is graphically shown in FIGS. 6 and 7. Specifically, in FIG. 6, the second number N2 exceeds N1+$\Delta$N. Therefore, the die represented in FIG. 6 is determined to be acceptable and not defective. In FIG. 7, the second number N2 does not exceed N1+$\Delta$N. Therefore, the die represented in FIG. 7 is determined to be defective and not acceptable.

The above described technique, applied on a die by die basis, more accurately identifies defective die compared to using a fixed predetermined read current threshold, because it better detects the presence of a small number of read currents for one or a few memory cells that deviate from the general distribution of read currents for the rest of the memory cells (i.e., better detects outlier read currents characteristic of defective memory cells and die). The technique also accommodates variations in the distribution of read currents that can vary die to die. The values of $\Delta$RC and $\Delta$N can be chosen based on the properties of the distribution D. As a non-limiting example, $\Delta$RC can be with a range of 4-5 µA, and $\Delta$N can be a low number such as within a range of 1-3. The above described technique can be implemented on memory cells before the bake operation or electrical stress, after them, or both. In addition, the bake operation or electrical stress could be performed before the erase operation (i.e., before Step 1 of FIG. 5) or could be performed after the erase operation (Step 1) but before the first read operation (Step 3) in FIG. 5.

Figure 8:
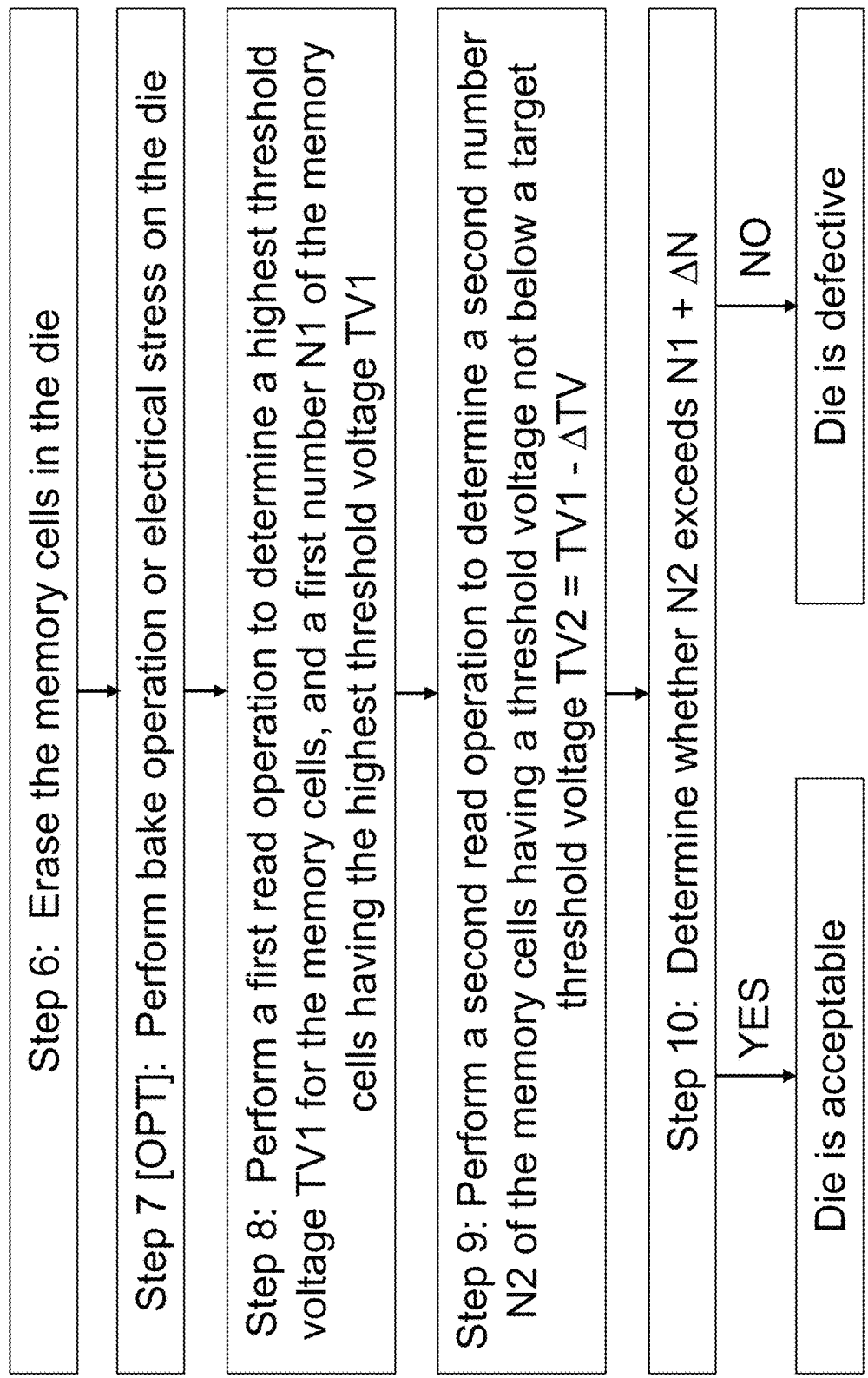
FIG. 8 is a flow diagram illustrating the steps in determining if a die is defective using threshold voltage instead of read current.
Figure 10:
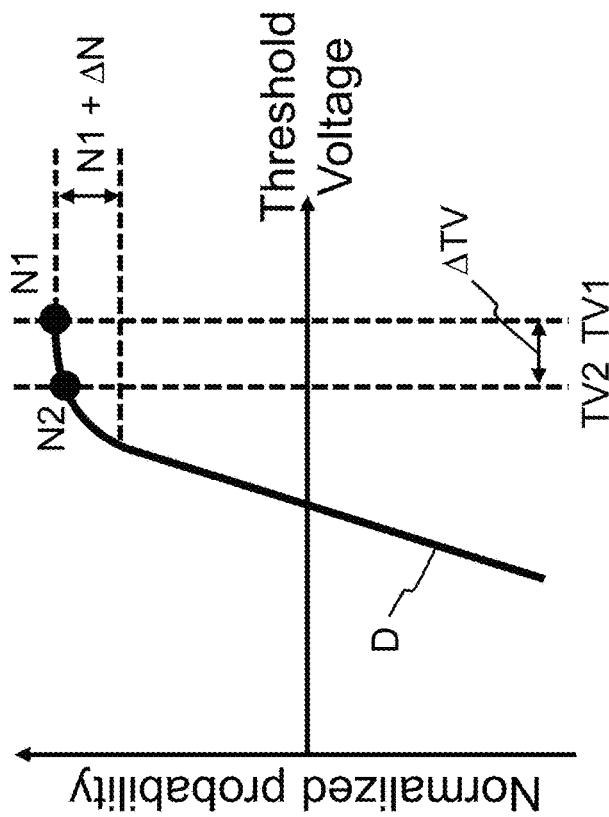
FIG. 10 is a graph illustrating the application of the steps in FIG. 8 for a die having defective memory cells.
Figure 9:
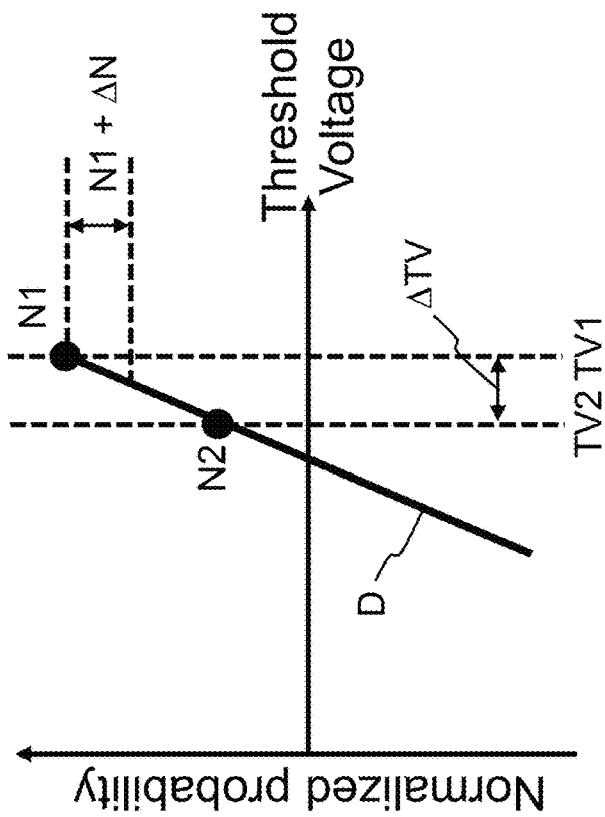
FIG. 9 is a graph illustrating the application of the steps in FIG. 8 for a die having no defective memory cells.

The above described technique can be implemented using a different electrical parameter than read current. For example, threshold voltage could be used instead of read current. Threshold voltage is the minimum voltage applied to one of the gates of a memory cell (other than the floating gate) such that the channel region is sufficiently conductive to consider the memory cell turned on. Threshold voltage can be determined by ramping up the applied voltage during a read operation until the read current reaches a predetermined read current. When the read current reaches the predetermined read current, the applied voltage at that point is the memory cell's threshold voltage. Using threshold voltage instead of read current is illustrated in FIG. 8, and shown in FIG. 9 (with distribution D of normalized probability of threshold voltage for a die with only good memory cells) and FIG. 10 (with distribution D of normalized probability of threshold voltage for a die with some defective memory cells). The memory cells in the die are erased using an erase operation (Step 6). In Step 7, an optional bake operation or electrical stress is performed. In Step 8, a first read operation is performed to determine the highest threshold voltage TV1 for all the memory cells being tested, and a first number N1 of the memory cells having that highest threshold voltage TV1. In Step 9, a second read operation is performed to determine a second number N2 of the memory cells having a threshold voltage not below (i.e. equal to or above) a target threshold voltage TV2, where TV2=TV1−$\Delta$TV. The value $\Delta$TV is a predetermined voltage value, and can be selected so that the target threshold voltage TV2 corresponds to threshold voltage for memory cells in a main portion of the distribution D. In Step 10, it is determined whether the second number N2 exceeds the first number N1 plus $\Delta$N, where $\Delta$N is a predetermined number. If the determination is yes, that the second number N2 exceeds N1+$\Delta$N, then the die containing the memory cells is determined to be acceptable. Conversely, if the determination is no, that the second number N2 does not exceed N1+$\Delta$N, then the die containing the memory cells is determined to be defective. As a non-limiting example, $\Delta$TV can be within a range of 0.5-1.0 V, and $\Delta$N can be a low number such as within a range of 1-3.

Figure 11:
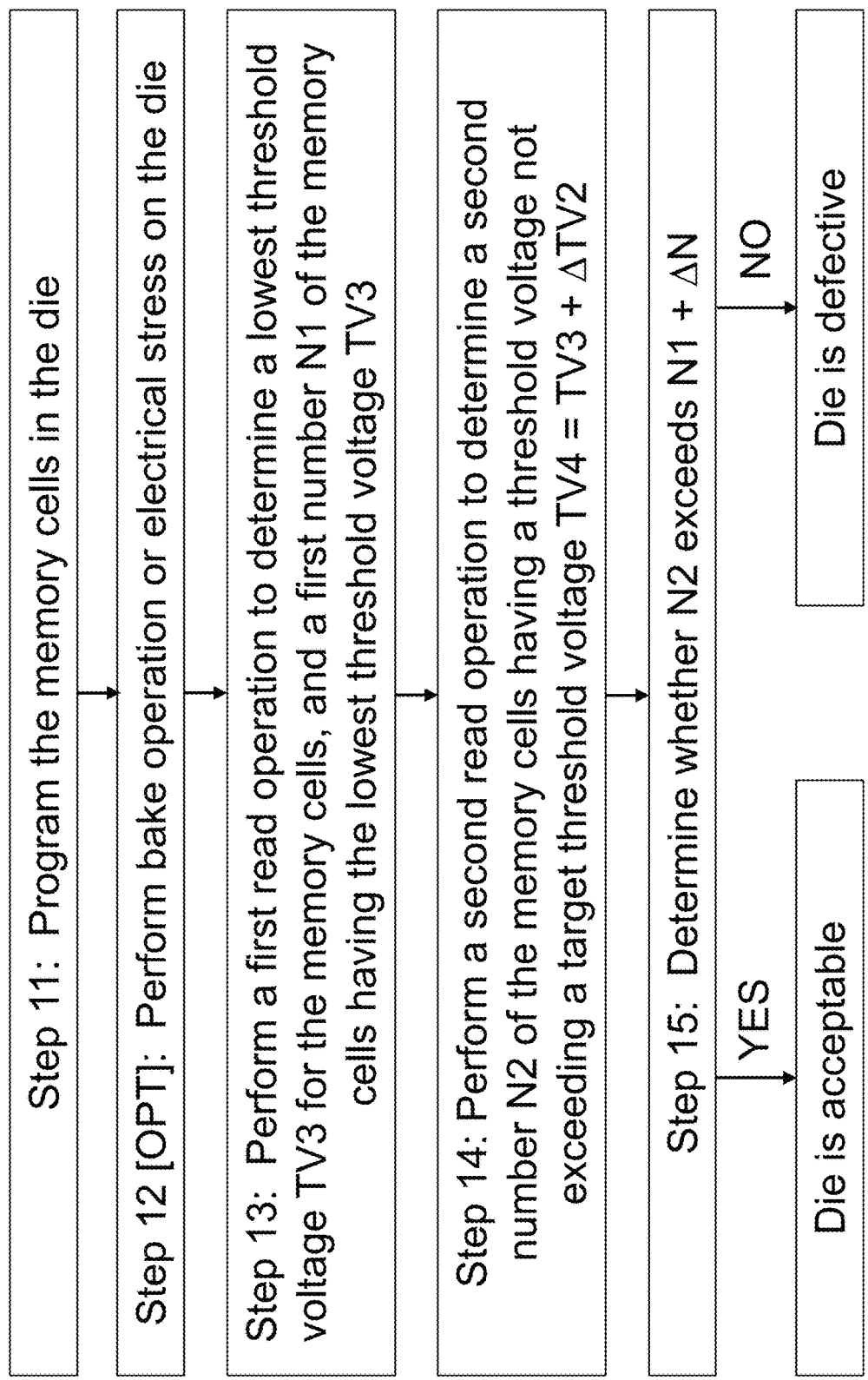
FIG. 11 is a flow diagram illustrating the steps in determining if a die is defective using threshold voltage and programmed memory cells.
Figure 13:
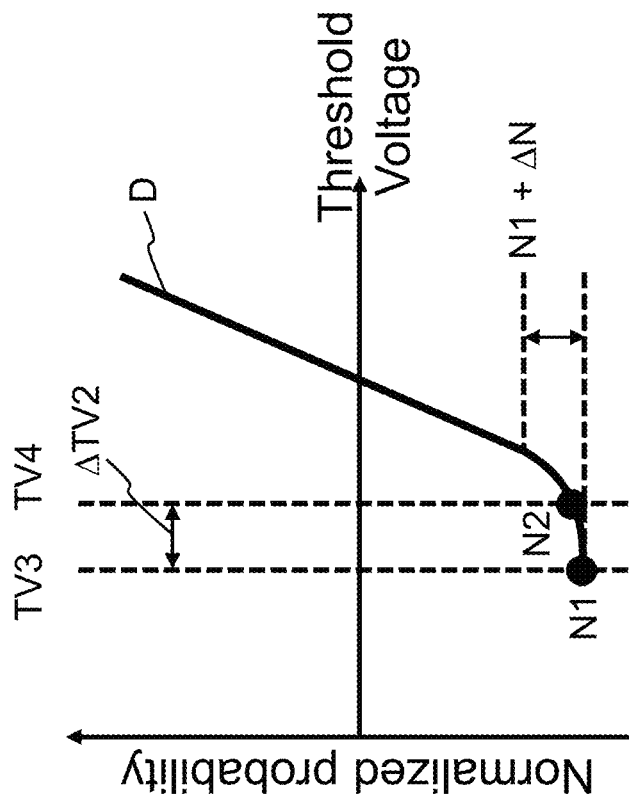
FIG. 13 is a graph illustrating the application of the steps in FIG. 11 for a die having defective memory cells.
Figure 12:
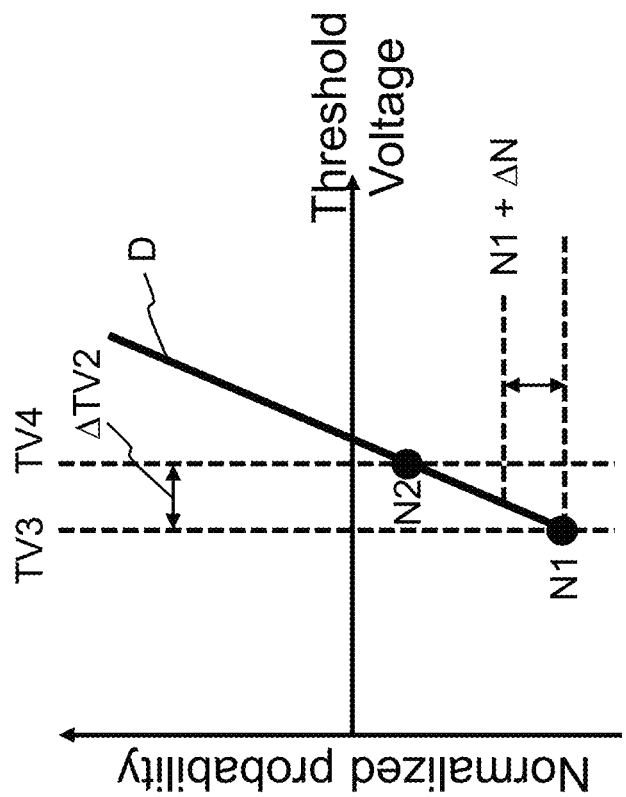
FIG. 12 is a graph illustrating the application of the steps in FIG. 11 for a die having no defective memory cells.

The technique described above with respect to FIGS. 8-10 using threshold voltage can be implemented using programmed memory cells instead of erased memory cells. Using programmed memory cells and threshold voltage is illustrated in FIG. 11, and shown in FIG. 12 (with distribution D of normalized probability of threshold voltage for a die with only good memory cells) and FIG. 13 (with distribution D of normalized probability of threshold voltage for a die with some defective memory cells). In Step 11, the memory cells in the die are programmed using a program operation (i.e., a conventional program operation well known in the art). Programming memory cells can include applying one or more pulses of voltages to each memory cell to place electrons on the floating gate. In Step 12, an optional bake operation or electrical stress is performed. In Step 13, a first read operation is performed to determine the lowest threshold voltage TV3 for all the memory cells being tested, and a first number N1 of the memory cells having that lowest threshold voltage TV3. In Step 14, a second read operation is performed to determine a second number N2 of the memory cells having a threshold voltage not exceeding (i.e. equal to or below) a target threshold voltage TV4, where TV4=TV3+ΔTV2. The value ΔTV2 is a predetermined voltage value, and can be selected so that the target threshold voltage TV4 corresponds to threshold voltage for memory cells in a main portion of the distribution D. In Step 15, it is determined whether the second number N2 exceeds the first number N1 plus ΔN, where ΔN is a predetermined number. If the determination is yes, that the second number N2 exceeds N1+ΔN, then the die containing the memory cells is determined to be acceptable. Conversely, if the determination is no, that the second number N2 does not exceed N1+ΔN, then the die containing the memory cells is determined to be defective. As a non-limiting example, ΔTV2 can be within a range of 0.5-1.0 V, and ΔN can be a low number such as within a range of 1-3.

It is to be understood that the present invention is not limited to the example(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims.

What is claimed is:

1. A method of testing non-volatile memory cells formed on a die, comprising:
    erasing the non-volatile memory cells;
    performing a first read operation on the non-volatile memory cells after the erasing of the non-volatile memory cells to determine a lowest read current RC1 for the non-volatile memory cells during the first read operation and a first number N1 of the non-volatile memory cells having the lowest read current RC1 during the first read operation;
    performing a second read operation on the non-volatile memory cells to determine a second number N2 of the non-volatile memory cells having a read current during the second read operation not exceeding a target read current RC2, wherein the target read current RC2 is equal to the lowest read current RC1 plus a predetermined current value;
    determining whether the second number N2 exceeds the first number N1 plus a predetermined number; and
    determining the die is acceptable if the second number N2 is determined to exceed the first number N1 plus the predetermined number, or determining the die is defective if the second number N2 is determined not to exceed the first number N1 plus the predetermined number.

2. The method of claim 1, wherein the predetermined current value is within a range of 4-5 μA.

3. The method of claim 1, wherein the predetermined number is within a range of 1-3.

4. The method of claim 1, further comprising:
    performing a bake operation on the die before the performing of the first read operation.

5. The method of claim 1, further comprising:
    performing an electrical stress on the non-volatile memory cells before the performing of the first read operation.

6. A method of testing non-volatile memory cells formed on a die, comprising:
    erasing the non-volatile memory cells;
    performing a first read operation on the non-volatile memory cells after the erasing of the non-volatile memory cells to determine a highest threshold voltage TV1 for the non-volatile memory cells during the first read operation and a first number N1 of the non-volatile memory cells having the highest threshold voltage TV1 during the first read operation;
    performing a second read operation on the non-volatile memory cells to determine a second number N2 of the non-volatile memory cells having a threshold voltage during the second read operation not below a target threshold voltage TV2, wherein the target threshold voltage TV2 is equal to the highest threshold voltage TV1 minus a predetermined voltage value;
    determining whether the second number N2 exceeds the first number N1 plus a predetermined number; and
    determining the die is acceptable if the second number N2 is determined to exceed the first number N1 plus the predetermined number, or determining the die is defective if the second number N2 is determined not to exceed the first number N1 plus the predetermined number.

7. The method of claim 6, wherein the predetermined voltage value is within a range of 0.5-1.0 V.

8. The method of claim 6, wherein the predetermined number is within a range of 1-3.

9. The method of claim 6, further comprising:
    performing a bake operation on the die before the performing of the first read operation.

10. The method of claim 6, further comprising:
    performing an electrical stress on the non-volatile memory cells before the performing of the first read operation.

11. A method of testing non-volatile memory cells formed on a die, comprising:
    programming the non-volatile memory cells;
    performing a first read operation on the non-volatile memory cells after the programming of the non-volatile memory cells to determine a lowest threshold voltage TV3 for the non-volatile memory cells during the first read operation and a first number N1 of the non-volatile memory cells having the lowest threshold voltage TV3 during the first read operation;
    performing a second read operation on the non-volatile memory cells to determine a second number N2 of the non-volatile memory cells having a threshold voltage during the second read operation not exceeding a target threshold voltage TV4, wherein the target threshold voltage TV4 is equal to the lowest threshold voltage TV3 plus a predetermined voltage value;

determining whether the second number N2 exceeds the first number N1 plus a predetermined number; and determining the die is acceptable if the second number N2 is determined to exceed the first number N1 plus the predetermined number, or determining the die is defective if the second number N2 is determined not to exceed the first number N1 plus the predetermined number.

12. The method of claim 11, wherein the predetermined voltage value is within a range of 0.5-1.0 V.

13. The method of claim 11, wherein the predetermined number is within a range of 1-3.

14. The method of claim 11, further comprising:
performing a bake operation on the die before the performing of the first read operation.

15. The method of claim 11, further comprising:
performing an electrical stress on the non-volatile memory cells before the performing of the first read operation.

* * * * *